(12) United States Patent
Furman

(10) Patent No.: US 6,335,661 B1
(45) Date of Patent: Jan. 1, 2002

(54) BALANCED INPUT FOR TEMPERATURE SENSOR

(75) Inventor: Bruce Michael Furman, Palo Alto, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/569,966

(22) Filed: May 11, 2000

(51) Int. Cl.[7] .............................. H03F 3/04; H03F 3/45
(52) U.S. Cl. .................... 330/301; 330/69; 330/252; 330/256
(58) Field of Search .......................... 330/69, 252, 256, 330/301

(56) References Cited

U.S. PATENT DOCUMENTS

| 4,475,103 A | * | 10/1984 | Brokaw et al. | ............. 330/256 |
| 5,030,924 A | * | 7/1991 | Fritz | ............................ 330/256 |
| 5,138,318 A | * | 8/1992 | Matsuzawa | .................. 330/252 |
| 5,374,897 A | * | 12/1994 | Moraveji | ..................... 330/252 |
| 5,805,011 A | * | 9/1998 | Comino | ....................... 327/563 |
| 6,121,838 A | * | 9/2000 | Freeman et al. | ............ 330/256 |

* cited by examiner

*Primary Examiner*—Robert Pascal
*Assistant Examiner*—Patricia T. Nguyen
(74) *Attorney, Agent, or Firm*—Blakely, Sokoloff, Taylor & Zafman LLP

(57) ABSTRACT

A balanced input circuit which is used with an operational amplifier to obtain the difference between two input signals. In a temperature sensor application, one input signal is proportional to absolute temperature (PTAT) and one signal is complimentary to absolute temperature (CTAT) with the CTAT signal being the base-emitter voltage ($V_{be}$) of a bipolar transistor. In this application the operational amplifier output is the PTAT signal minus $V_{be}$ times a scale factor determined by the feedback loop of the operational amplifier.

9 Claims, 1 Drawing Sheet

BALANCED INPUT FOR TEMPERATURE SENSOR

BACKGROUND OF THE INVENTION

This invention relates generally to electronic circuits, and more particularly the invention relates to analog electronic circuits.

Analog circuits typically operate on linear or analog signals which represent real world phenomena such as temperature, pressure, and sound and are continuously variable over a wide range of values. This is to be distinguished from digital signals which represent the "ones" and "zeros" of binary arithmetic.

In temperature sensor products, for example, a signal proportional to absolute temperature (PTAT) and a signal complimentary to absolute temperature (CTAT) are obtained and manipulated. The PTAT signal, voltage or current, is generally developed by applying the voltage difference of two bipolar junctions (transistors or diodes) running at different current density across a resistor. The current through the bipolar junctions should be constant or exponential in temperature. The CTAT signal, voltage or current, is developed by applying the voltage from a single bipolar junction (transistor or diode) across a resistor.

For a temperature sensor product, one wants to take a PTAT signal and subtract the CTAT signal. The difference is then multiplied by a scaling factor. To accomplish the multiplication, an operational amplifier with a feedback ratio network is employed. The ratioed feedback signal from the operational amplified is subtracted from the input signal.

The present invention is directed to a circuit which allows the subtraction of the CTAT signal ($V_{be}$) from the PTAT signal, and then subtraction of a second signal or feedback from an operational amplifier.

SUMMARY OF THE INVENTION

In accordance with the invention, two current paths are provided with matched current sources. According to one embodiment, in one current path for the positive input, a first PNP bipolar transistor (or equivalent MOS transistor) is serially connected emitter to collector through a first base-emitter junction of an NPN transistor to a circuit ground. The base of the first PNP transistor receives a plus input (IN+). The NPN device is diode connected (base to collector).

In the other current path, for the negative input, a second base-emitter junction of an NPN transistor is serially connected through the emitter-collector of a second PNP bipolar transistor (or equivalent MOS transistor) to circuit ground. The base of the second PNP transistor receives a minus input (IN−). The NPN is diode connected. Outputs are taken at the emitter of the first PNP transistor (OUT+) and at the base of the second base-emitter junction (OUT−). The two outputs are combined to yield IN+−(IN−)−$V_{be}$.

The invention and objects and features thereof will be more readily apparent from the following detailed description and dependent claims when taken with the drawings.

DETAILED DESCRIPTION OF ILLUSTRATIVE EMBODIMENT

Figure 1:
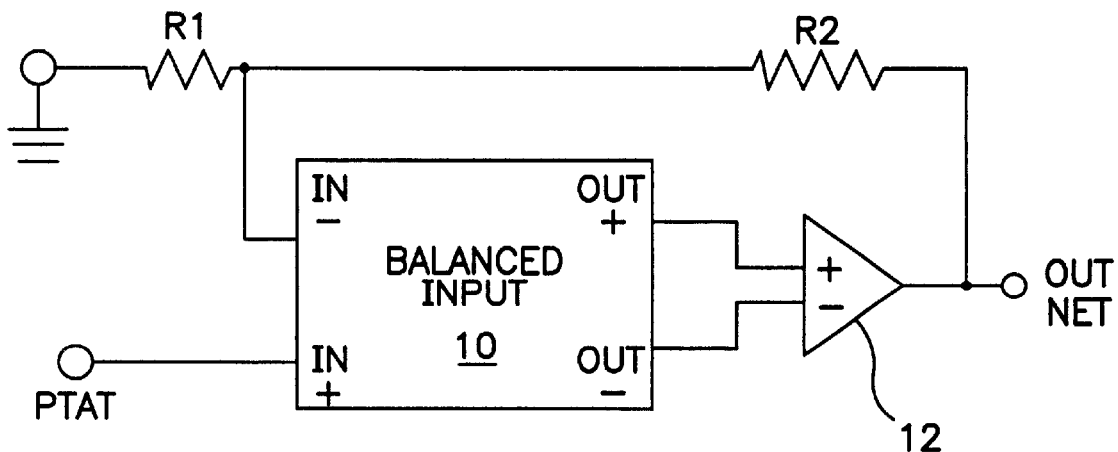
FIG. 1 is a schematic representation of an operational amplifier circuit in which the invention is employed.

FIG. 1 is a schematic of an operational amplifier circuit as used for a temperature sensor application, for example. A balanced input circuit shown generally at 10 has two inputs (IN−, IN+) and two outputs (OUT+, OUT−). The two outputs are applied to inputs of operational amplifier 12, and the difference of the two outputs amplified by a high gain amplifier is applied as the net output and is also applied as a feedback through resistor R2 to the IN−input. PTAT is applied to the IN+input. The high gain amplifier forces, through negative feedback, its two inputs to be equal, that is V(OUT+)=V(OUT−) since V(out+)−V(OUT−)=V(IN+)−V(IN−)−VBE we have 0=V(IN+)−V(IN−)−VBE. So V(in−)= V(IN+)−VBE now, because V(IN−) is high impedance, and the current through R1 and R2 are equal, $$V(OUT) = V(IN-) \cdot \frac{R2+R1}{R1} = (V(IN+) - VBE)\left(\frac{R2+R1}{R1}\right).$$

In accordance with the invention, the balanced input circuit 10 provides the two outputs, OUT+, OUT−, in accordance with the following equation:

$$V(OUT+)-V(OUT-)=V(IN+)-V_{be}-V(IN-).$$

Figure 2:
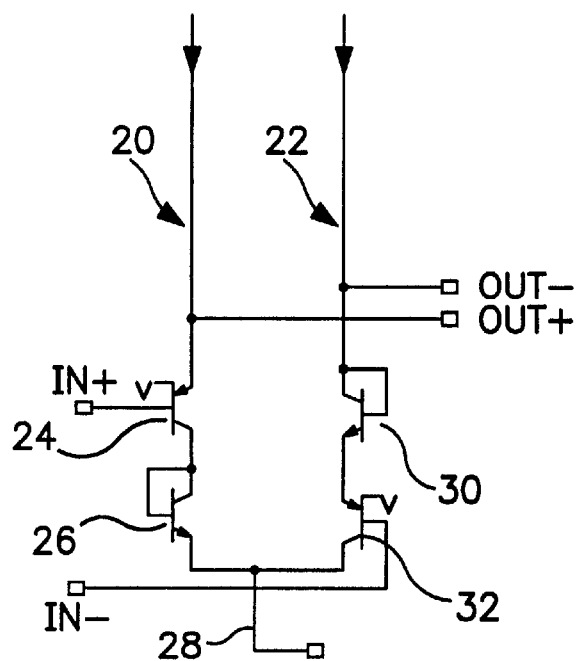
FIG. 2 is a schematic of a balanced input stage in the circuit of FIG. 1 in accordance with an embodiment of the invention.

The circuit achieves the subtraction without an Early effect error by maintaining the collector to emitter voltages equal in the transistors of the circuit. As shown in FIG. 2, two current paths 20, 22 are driven by matched currents with path 20 including a first PNP bipolar transistor 24 (or equivalent PMOS transistor) serially connected emitter to collector through a first base-emitter junction of an NPN transistor 26 to a circuit ground 28. The base of the first PNP transistor 24 receives the IN+input. The NPN is diode connected to match the NPN in the leg driven by the negative input.

The second current path 22 includes a second base-emitter junction of an NPN transistor 30 which is serially connected through the emitter-collector of a second PNP bipolar transistor 32 (or equivalent MOS transistor) to circuit ground 28. The base of the second PNP transistor 32 receives the IN−input, which is scaled by resistors R1, R2 in FIG. 1.

The first output, OUT+, is taken at the emitter of PNP transistor 24, and a second output, OUT−, is taken at the base of the second base-emitter junction. The two outputs are combined to yield IN+−IN−minus $V_{be}$. Thus, the circuit of FIG. 2 allows the subtraction of $V_{be}$ from PTAT and then subtract a second signal which is a scaled feedback from the operational amplifier 12 of FIG. 1.

Circuitry in accordance with the invention provides a complimentary absolute temperature signal to be subtracted from a proportional to absolute temperature signal as is required in temperature sensor products. While PNP bipolar transistors are illustrated in the preferred embodiment, PMOS transistors can be employed also. Further, NPN bipolar transistors can be employed by flipping the current sources and ground connections. NMOS transistors operating in the threshold conduction can be substituted for the NPN bipolar transistors. Thus, while the invention has been described with the reference to a specific embodiment, the description is illustrative of the invention and is not to be construed as limiting the invention. Various modifications and applications may occur to those skilled in the arts without departing from the true spirit and scope of the invention as defined by the dependent claims.

What is claimed is:

1. A balanced input circuit for an operational amplifier comprising:

a) a first current path including a first transistor serially connected with a first diode between a first current source and a circuit ground, b) a second current path including a second diode serially connected with a second transistor between a second current source and the circuit ground, the first and second current sources being matched, c) a first input (IN+) connected to a control terminal of the first transistor, d) a second input (IN−) connected to a control terminal of the second transistor, e) a first output (OUT+) coupled to a terminal of the first transistor, and f) a second output (OUT−) coupled to a terminal of the second diode.

2. The balanced input stage as defined by claim 1 wherein the first and second transistors are bipolar transistors and the first and second diodes are diode connected bipolar transistors.

3. The balanced input stage as defined by claim 2 wherein the first and second transistors are PNP transistors, and the first and second diodes are diode connected NPN transistors.

4. The balanced input stage as defined by claim 3 wherein the first input is a signal proportional to absolute temperature (PTAT).

5. The balanced input stage as defined by claim 4 wherein the PTAT signal is generated by applying a voltage differential of two bipolar junctions running at different current densities across a resistor.

6. An operational amplifier circuit comprising:

A) an operational amplifier having a first (+) input and a second (−) input and an output (first input minus second input), B) an input circuit for the operational amplifier including:
  a) a first current path including a first transistor serially connected with a first diode between a first current source and a circuit ground,
  b) a second current path including a second diode serially connected with a second transistor between a second current source and the circuit ground, the first and second current sources being matched,
  c) a first input (IN+) connected to a control terminal of the first transistor,
  d) a second input (IN−) connected to a control terminal of the second transistor,
  e) a first output (OUT+) coupled to a terminal of the first transistor, and
  f) a second output (OUT−) coupled to a terminal of the second diode, and C) a feedback loop including a resistive element connecting the operational amplifier output to the second input of the input circuit.

7. The operational amplifier circuit as defined by claim 6 wherein the first input to the input circuit is a signal proportional to absolute temperature (PTAT), and the second input to the input circuit is a scaled signal from the operational amplifier output through the feedback loop.

8. The operational amplifier circuit as defined by claim 7 wherein the first and second transistors are bipolar transistors and the first and second diodes are diode-connected bipolar transistors.

9. The operational amplifier circuit as defined by claim 7 wherein the output of the operational amplifier is proportional to (PTAT minus $V_{be}$).

* * * * *